United States Patent [19]
Nogami et al.

[11] Patent Number: 6,001,415
[45] Date of Patent: Dec. 14, 1999

[54] VIA WITH BARRIER LAYER FOR IMPEDING DIFFUSION OF CONDUCTIVE MATERIAL FROM VIA INTO INSULATOR

[75] Inventors: Takeshi Nogami, Sunnyvale; Valery M. Dubin, Cupertino, both of Calif.

[73] Assignee: Advanced Micro Devices, Inc., Sunnyvale, Calif.

[21] Appl. No.: 08/984,229

[22] Filed: Dec. 3, 1997

[51] Int. Cl.⁶ .......................... B05D 5/12; H01L 21/4763
[52] U.S. Cl. ............................. 427/97; 427/98; 438/643; 438/653
[58] Field of Search .................. 427/97, 98, 99, 427/123, 124; 438/627, 643, 653, 687, 672, 675, 678, 696

[56] References Cited

U.S. PATENT DOCUMENTS

| | | | |
|---|---|---|---|
| 4,894,260 | 1/1990 | Kumasaka et al. | 427/241 |
| 5,486,492 | 1/1996 | Yamamoto et al. | 437/192 |
| 5,660,706 | 8/1997 | Zhao et al. | 205/123 |
| 5,674,787 | 10/1997 | Zhao et al. | 437/230 |

*Primary Examiner*—Brian K. Talbot
*Attorney, Agent, or Firm*—Monica H. Choi

[57] ABSTRACT

A via structure includes a barrier layer disposed between a via plug and an insulating layer surrounding a via hole to impede diffusion of conductive material from the via plug into the insulating layer. The barrier layer is deposited to cover the via side wall after the via hole is formed. The via hole is then filled with a via plug comprised of a conductive material such as copper that is amenable for fine line metallization with submicron and nanometer dimensions. The diffusion rate of copper through the barrier layer is significantly slower than the diffusion rate of copper through the insulating layer surrounding the via hole. With such an impedance of copper diffusion into the insulating layer, the insulating integrity of the insulating layer is preserved.

18 Claims, 3 Drawing Sheets

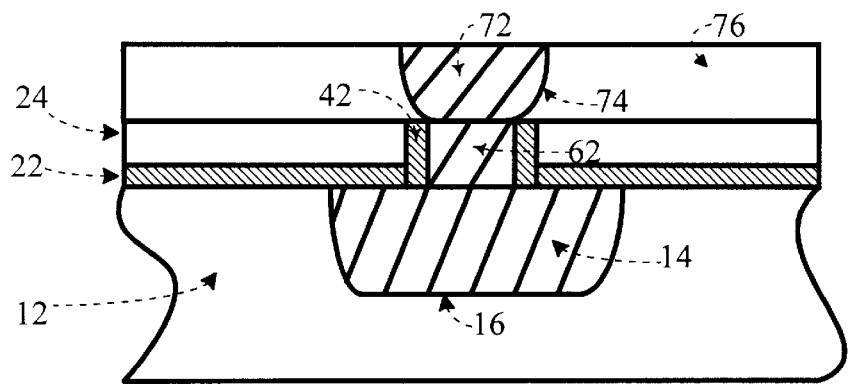
Fig. 7
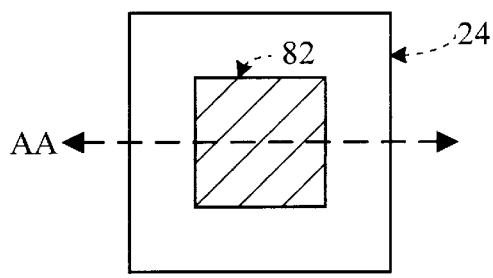 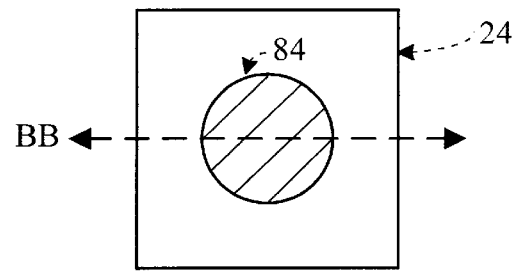
Fig. 8A  Fig. 8B
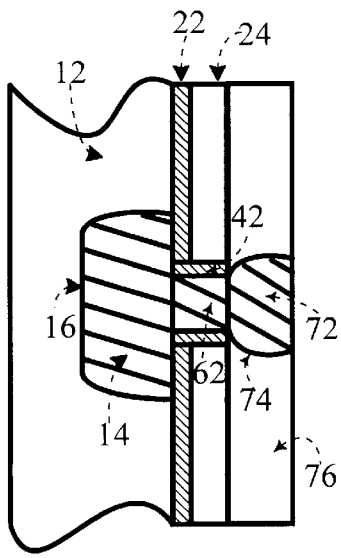 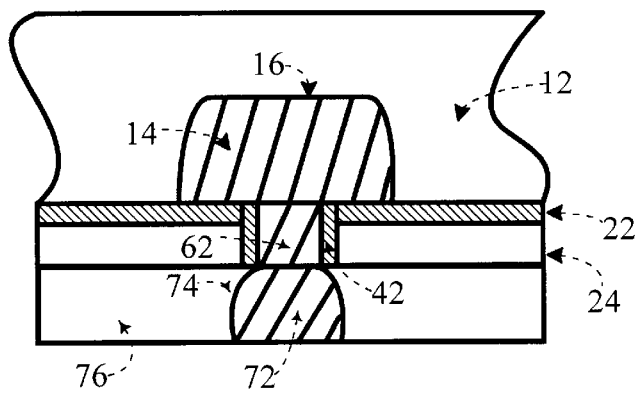
Fig. 9A  Fig. 9B

VIA WITH BARRIER LAYER FOR IMPEDING DIFFUSION OF CONDUCTIVE MATERIAL FROM VIA INTO INSULATOR

TECHNICAL FIELD

This invention relates to metallization in integrated circuits, and more particularly, to a via having a barrier layer for impeding diffusion of conductive material from a via plug into an insulating layer surrounding the via.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Thus far, aluminum has been prevalently used for metallization within integrated circuits. However, as the width of metal lines are scaled down to smaller submicron and even nanometer dimensions, aluminum metallization shows electromigration failure. Electromigration failure, which may lead to open and shorted metal lines, is now a commonly recognized problem. Moreover, as dimensions of metal lines further decrease, metal line resistance increases substantially, and this increase in line resistance may adversely affect circuit performance.

Given the concerns of electromigration and line resistance with smaller metal lines and vias, copper is considered a more viable metal for smaller metallization dimensions. Copper has lower bulk resistivity and potentially higher electromigration tolerance than aluminum. Both the lower bulk resistivity and the higher electromigration tolerance improve circuit performance.

However, copper is a mid-bandgap impurity in silicon and silicon dioxide. Thus, copper may diffuse easily into these common integrated circuit materials. For example, a copper plug within a via hole may contact the insulating layer surrounding the via hole. Because copper may easily diffuse into the insulating layer, this diffusion may degrade the performance of integrated circuits. Nevertheless, use of copper metallization is desirable for further scaling down integrated circuit dimensions because of the lower bulk resistivity and the higher electromigration tolerance.

SUMMARY OF THE INVENTION

Accordingly, a primary object of the present invention is to fill a via hole with a conductive material such as copper having a relatively lower bulk resistivity and a higher electromigration tolerance than aluminum, while at the same time impeding the diffusion of such a conductive material into the insulator surrounding the via hole.

In a general aspect of the present invention, a via structure within an integrated circuit comprises a first conductive layer of a first conductive material. The via structure further comprises an insulating layer of an insulating material disposed adjacent the first conductive layer. This insulating layer includes a via hole having at least one via side wall of the insulating material and having a via bottom wall of the first conductive material of the first conductive layer.

A barrier layer of a barrier material is deposited on the insulating material of the via side wall and on the conductive material at the via bottom wall. Part of the barrier layer which is located at the via bottom wall is removed. The via hole is then filled with a via plug of a second conductive material. The second conductive material of the via plug is conductively coupled to the first conductive material at the via bottom wall and contacts the barrier material on the via side wall. Thus, the barrier layer is disposed between the second conductive material of the via plug and the insulating material of the via side wall. This barrier layer impedes the diffusion of the second conductive material from the via plug into the insulating material of the via side wall.

The present invention can be used to particular advantage for scaled down submicron integrated circuit metallization, especially when the first conductive material and the second conductive material are copper and the insulating material is silicon dioxide. In that case, the copper of the via bottom wall is exposed, and the copper via plug is formed by copper electroless plating.

These and other features and advantages of the present invention will be better understood by considering the following detailed description of the invention which is presented with the attached drawings.

BRIEF DESCRIPTION OF THE DRAWINGS

FIGS. 1,2,3,4,5,6, and 7 are cross-sectional views depicting steps for fabricating a via structure according to a preferred embodiment of the present invention;

FIG. 8 includes FIGS. 8A and 8B which are top views of a portion of an integrated circuit having a via hole; and FIG. 9 includes FIGS. 9A and 9B; FIG. 9A is the via structure of FIG. 7 shown disposed side-ways from the reference of FIG. 7, and FIG. 9B is the via structure of FIG. 7 shown disposed upside-down from the reference of FIG. 7.

Figure 1:
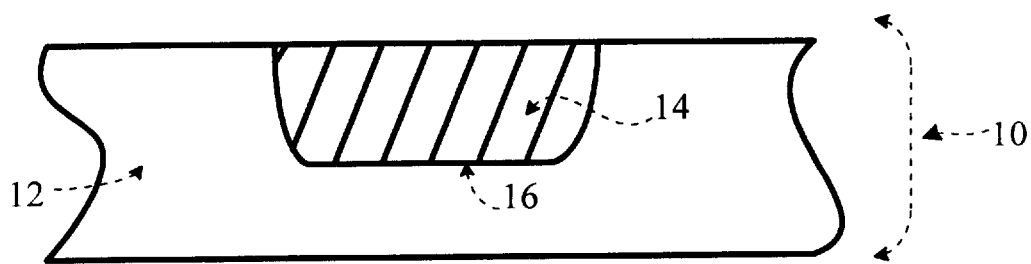

The figures referred to herein are drawn for clarity of illustration and are not necessarily drawn to scale. Moreover, the figures referred to herein focus on a via structure within a larger integrated circuit. Elements having the same reference numeral in FIGS. 1,2,3,4,5,6,7,8, and 9 refer to the same element.

DETAILED DESCRIPTION

Referring to FIG. 1, an IC (Integrated Circuit) cross section 10 includes a first insulating layer 12 of an insulating material. This insulating material is typically silicon dioxide for conventional silicon based integrated circuits and may sit on top of a silicon wafer (not shown in FIGS. 1,2,3,4,5,6,7,8, and 9 for clarity of illustration).

A first conductive layer 14 of a first conductive material is within a trench 16 in the first insulating layer 12. A via structure according to a preferred embodiment of the present invention is comprised of copper. Thus, the first conductive material of the first conductive layer 14 in a preferred embodiment of the present invention is copper. Because copper is not as volatile as aluminum, copper lines are typically formed by etching the trench 16 within the first insulating layer 12, and filling that trench with copper 14 as shown in FIG. 1.

Figure 2:
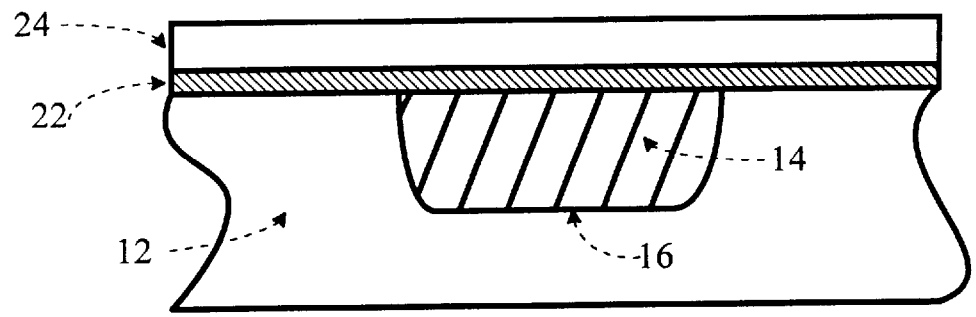

Referring to FIG. 2, a first cap insulating layer 22 and an interlevel insulating layer 24 are deposited on top of the IC cross section 10 of FIG. 1. Note that elements having the same reference numeral throughout FIGS. 1,2,3,4,5,6,7,8, and 9 refer to the same cross sectional element. The first cap insulating layer 22 is comprised of an insulating material which impedes diffusion of copper from the first conductive layer 14 into the interlevel insulating layer 24. The insulating material of the first cap insulating layer 22 may be any of silicon nitride, silicon oxynitride, or phosphorous silicon oxide.

The first cap insulating layer 22 and the interlevel insulating layer 24 are deposited primarily to conductively isolate metal layers on different metal levels. First level metal lines, including the first copper layer 14, run below the first cap insulating layer 22 and the interlevel insulating layer 24, and second level metal lines run above the interlevel insulating layer 24. The insulating material of the interlevel insulating layer 24 is typically silicon dioxide for conventional silicon based integrated circuits.

Because copper diffuses relatively easily in silicon dioxide, the first cap insulating layer 22 is deposited between the first copper layer 14 and the interlevel insulating layer 24. The diffusion rate of copper through the first cap insulating layer 22 is significantly less than the diffusion rate of copper through the interlevel insulating layer 24. Thus, the first cap insulating layer 22 impedes diffusion of copper from the first copper layer 14 into the interlevel insulating layer 24. By minimizing copper impurities in the interlevel insulating layer 24, conductive isolation between metals below and above the interlevel insulating layer 24 is preserved for a longer life time of integrated circuit functionality.

Vias conductively couple metals and other conductive materials on different metal levels. In FIGS. 1,2,3,4,5,6,7,8, and 9 assume that the first copper layer 14 below the first cap insulating layer 22 must be conductively coupled with a second metal layer above the interlevel insulating layer 24.

Figure 3:
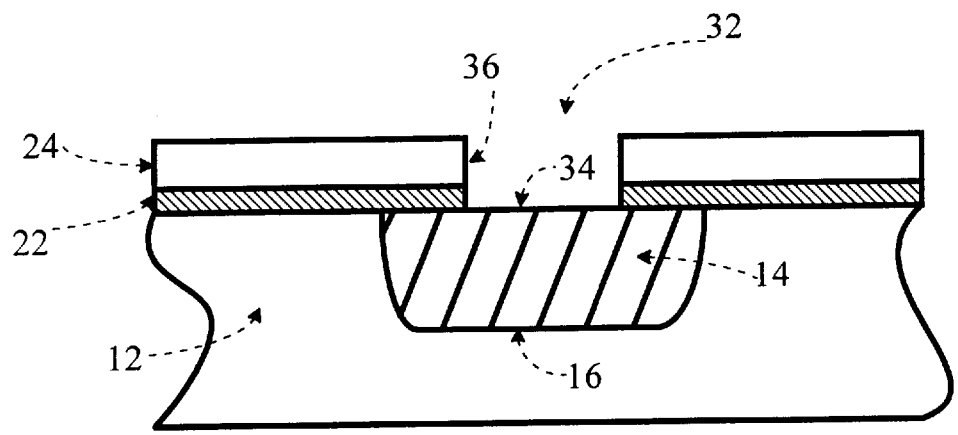

Referring to FIG. 3, a via hole 32 has been etched through the first cap insulating layer 22 and the interlevel insulating layer 24. This via hole has a via bottom wall 34 of copper of the first copper layer 14 and has at least one via side wall 36 of silicon dioxide of the interlevel insulating layer 24.

The via hole 32 is filled with a via plug of a second conductive material which conductively couples the first copper layer 14 below the first cap insulating layer 22 to a second metal layer above the interlevel insulating layer 24. The via plug is typically also comprised of copper.

If a copper plug within the via hole 32 of FIG. 3 contacts the silicon dioxide of the interlevel insulating layer 24 on the via side wall 36, such a contact results in diffusion of copper from the copper via plug into the silicon dioxide at the via side wall 36 and in subsequent degradation of the interlevel insulating layer 24.

Figure 4:
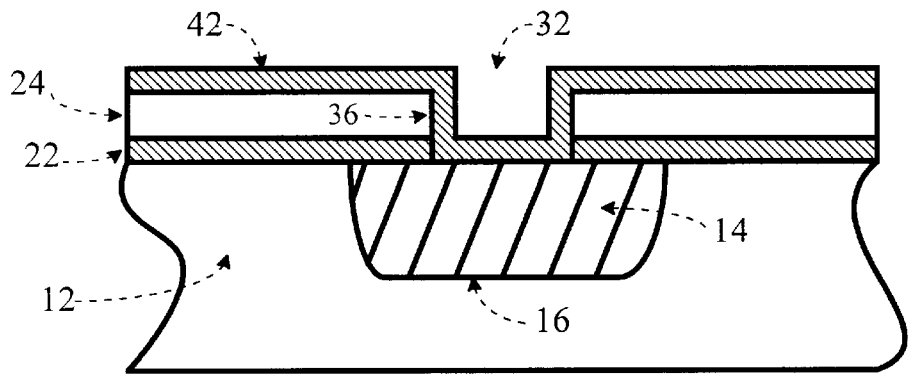

Referring to FIG. 4, to impede the diffusion of copper from the via plug into the silicon dioxide at the via side wall 36, a barrier layer 42 is deposited covering the interlevel insulating layer 24 at the via side wall 36. The diffusion rate of copper through this barrier layer 42 is significantly less than the diffusion rate of copper through the interlevel insulating layer 24. Thus, the barrier layer 42 impedes diffusion of copper from the copper plug within the via hole 32 into the interlevel insulating layer 24. This barrier layer 42 may be comprised of any of the following barrier metals which are such effective barriers against copper diffusion: tantalum, tantalum nitride, tantalum copper, tantalum silicon nitride, tungsten, tungsten nitride, tungsten silicon nitride, titanium nitride, titanium/titanium nitride, and titanium silicon nitride. Also, this barrier layer 42 may also be comprised of any of the following insulating films which are effective barriers against copper diffusion: silicon nitride, silicon oxynitride, and phosphorous silicon oxide.

Although the present invention is primarily concerned with preserving the insulating integrity of the interlevel insulating layer 24 surrounding a via, the insulating integrity of the first insulating layer 12 may also be preserved by depositing a layer of barrier material within trench 16 before copper 14 is deposited into the trench 16. The barrier material within trench 16 may be similar to that used for the barrier layer 42.

Figure 5:
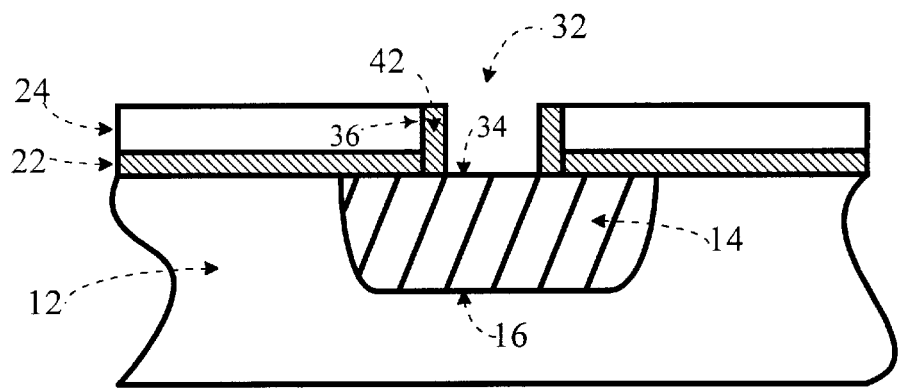

The via plug within the via hole 32 is conductively coupled to the first copper layer 14. Referring to FIG. 5, the barrier material which is located at the via bottom wall is removed. This removal may be made by using Ar (argon) ion sputtering or by using plasma etching. Both of these etching processes have a directionality which is perpendicular to the silicon substrate, and thus, the etching is made preferentially for the barrier material at the via bottom wall 34 (and at the top of the interlevel insulating layer 24) while the barrier material at the via side wall 36 is preserved. In such an etching process, bias is imposed on the silicon wafer, and charged particles are then accelerated perpendicular to the silicon wafer. The etching process may be an additional step in an ion metal plasma sputtering process for depositing the barrier layer 42.

Figure 6:
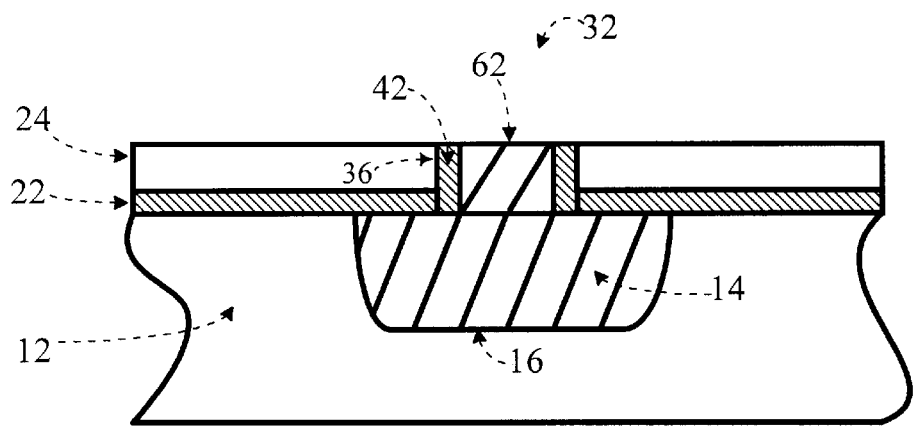

Referring to FIGS. 5 and 6, with the barrier layer 42 covering the via side wall 36 and with the copper at the via bottom wall 34 exposed, a via plug 62 fills the via hole 32. The via plug 62 is preferably formed within the via hole 32 by copper electroless plating. A copper electroless plating process is described in U.S. Pat. No. 4,894,260 to Kumasaka et al. which is incorporated herein by reference in its entirety. The copper at the via bottom wall 34 acts as a seed in the copper electroless plating process.

Referring to FIGS. 6 and 7, a second metal layer 72 on a second metal level above the interlevel insulating layer 24 is deposited on top of the via plug 62. This second metal layer 72 may also be comprised of copper which is deposited in a trench 74 within an upper insulating layer 76. Another barrier layer (not shown in FIG. 7 for clarity of illustration) may first be deposited in the trench 74 before copper 72 is deposited into the trench 74 to impede diffusion of copper from the second metal line 72 into the upper insulating layer 76. This barrier layer within trench 74 may be comprised of a barrier material that is similar to that used for the barrier layer 42. In this manner, the via plug 62 conductively couples the first copper layer 14 and the second copper layer 72, which are on different metal levels.

The barrier layer 42 in FIG. 7 impedes diffusion of copper from the via plug 62 into the interlevel insulating layer 24 at the via side wall. With such a barrier layer 42, the insulating property of the interlevel insulating layer 24 is preserved for conductively isolating the first copper layer 14 from the second copper layer 72 at field regions outside the area of the via hole 32.

The foregoing is by way of example only and is not intended to be limiting. For example, the advantageous features of the present invention may be used in conjunction with other conductive materials, aside from just copper, that are amenable for fine line metallization and that diffuse easily into an insulating material. In addition, the present invention may be used for impeding diffusion of a conductive material from the via plug into any insulating material. The barrier layer, disposed between the conductive material of the via plug and the insulating material of the via side wall, may be comprised of any material which impedes the diffusion of the conductive material from the via plug into the via side wall.

Furthermore, the present invention may be used for various shapes of the via hole 32. For example, FIG. 8A shows a square via hole 82 within the interlevel insulating layer 24. In that case, the cross sectional views of FIGS. 1,2,3,4,5,6, and 7 are taken along line AA. FIG. 8B shows a circular via hole 84 within the interlevel insulating layer 24. In that case, the cross sectional views of FIGS. 1,2,3,4,5,6, and 7 are taken along line BB. The present invention may be used for any other via hole shape.

In addition, the via structure of the present invention may be made and/or used sideways from the reference orientation of FIG. 7 as shown in FIG. 9A, or upside down from the reference orientation of FIG. 7 as shown in FIG. 9B, or in any other orientation. As will be understood by those skilled in the art, the integrated circuit structures described herein may be made or used in the same way regardless of their position and orientation. Accordingly, it is to be understood that terms and phrases such as "bottom wall,""side wall, ""above,"and "on top of"as used herein refer to the relative location and orientation of various portions of the structures with respect to one another, and are not intended to suggest that any particular absolute orientation with respect to external objects is necessary or required. The invention is limited only as defined in the following claims and equivalents thereof.

We claim:

1. A method for filling a via hole within an integrated circuit, the via hole having at least one via side wall of insulating material and having a via bottom wall of a first conductive material, the method comprising the steps of:

depositing a layer of barrier metal on the insulating material of the via side wall and on the first conductive material of the via bottom wall, wherein said layer of barrier metal is a diffusion barrier that impedes diffusion of a second conductive material within the via hole into the insulating material of the via side wall;

etching the layer of barrier metal from the via bottom wall such that the first conductive material is exposed at the via bottom wall and such that the layer of barrier metal remains on the via side wall; and using substantially only said first conductive material at the via bottom wall as a seed layer for electroless deposition of said second conductive material to fill the via hole, wherein said second conductive material diffuses in said barrier metal with a substantially slower rate than in said insulating material of said via side wall;

and wherein the second conductive material within the via hole is conductively coupled to the first conductive material at the via bottom wall and contacts the barrier metal on the via side wall.

2. The method of claim 1, wherein the first conductive material is same as the second conductive material.

3. The method of claim 2, wherein the first conductive material and the second conductive material are copper.

4. The method of claim 3, wherein said step of etching further includes the step of:

exposing copper at the via bottom wall before filling the via hole by electroless plating of copper.

5. The method of claim 1, wherein said step of depositing the barrier metal uses an ion metal plasma sputtering process and wherein said step of etching the barrier metal from the via bottom wall further includes the step of removing the layer of barrier metal from the via bottom wall by plasma etching, during the ion metal plasma sputtering process, with directionality to preserve the barrier metal at the via side wall.

6. The method of claim 1, wherein the barrier metal is selected from the group consisting of tantalum, tantalum nitride, tantalum copper, tantalum silicon nitride, tungsten, tungsten nitride, tungsten silicon nitride, titanium nitride, titanium/titanium nitride, and titanium silicon nitride.

7. The method of claim 1, wherein the insulating material is silicon dioxide.

8. The method of claim 7, wherein the first conductive material and the second conductive material are copper.

9. A method for filling a via hole within an integrated circuit, the a hole having at least one via side wall of silicon dioxide and having a via bottom wall of copper, the method comprising the steps of:

depositing a layer of barrier metal on the silicon dioxide of the via side wall and on the copper of the via bottom wall by using an ion metal sputtering process, wherein said layer of barrier metal is a diffusion barrier that impedes diffusion of copper within the via hole into the insulating material of the via side wall, and wherein the barrier metal is selected from the group consisting of tantalum, tantalum nitride, tantalum copper, tantalum silicon nitride, tungsten, tungsten nitride, tungsten silicon nitride, titanium nitride, titanium/titanium nitride, and titanium silicon nitride;

exposing the copper on the via bottom wall by etching the layer of barrier metal from the via bottom wall by plasma etching, during the metal ion sputtering process, with directionality to preserve the barrier metal at the via side wall; and using substantially only the copper at the via bottom wall as a seed layer for electroless deposition of copper to fill the via hole, wherein said copper within said via hole diffuses in said barrier metal with a substantially slower rate than in said silicon dioxide of said via side wall;

and wherein the copper within the via hole contacts the copper at the via bottom wall and contacts the barrier metal on the via side wall.

10. A method for filling a via hole within an integrated circuit, the via hole having at least one via side wall of insulating material and having a via bottom wall of a first conductive material, the method comprising the steps of:

depositing a cap insulating layer of a dielectric material between the first conductive material and the insulating material to prevent contact of the first conductive material with said insulating material, wherein said cap insulating layer is a diffusion barrier that impedes diffusion of the first conductive material into said insulating material;

depositing a layer of barrier metal on the insulating material of the via side wall and on the first conductive material of the via bottom wall, wherein said layer of barrier metal is a diffusion barrier that impedes diffusion of a second conductive material within the via hole into the insulating material of the via side wall;

etching the layer of barrier metal from the via bottom wall such that the first conductive material is exposed at the via bottom wall and such that the layer of barrier metal remains on the via side wall; and using substantially only said first conductive material at the via bottom wall as a seed layer for electroless deposition of the second conductive material to fill the via hole, wherein said second conductive material diffuses in said barrier metal with a substantially slower rate than in said insulating material of said via side wall;

and wherein the second conductive material within the via hole is conductively coupled to the first conductive material at the via bottom wall and contacts the barrier metal on the via side wall.

11. The method of claim 10 wherein said dielectric material of said cap insulating layer is selected from the group consisting of silicon nitride, silicon oxynitride, and phosphorous silicon oxide.

12. The method of claim 10, wherein the first conductive material is same as the second conductive material.

13. The method of claim 12, wherein the first conductive material and the second conductive material are copper.

14. The method of claim 13, wherein said step of etching further includes the step of:

exposing copper at the via bottom wall before filling the via hole by electroless plating of copper.

15. The method of claim 10, wherein said step of depositing the barrier metal uses an ion metal plasma sputtering process and wherein said step of etching the barrier metal from the via bottom wall further includes the step of removing the layer of barrier metal from the via bottom wall by plasma etching, during the ion metal plasma sputtering process, with directionality to preserve the barrier metal at the via side wall.

16. The method of claim 10, wherein the barrier metal is selected from the group consisting of tantalum, tantalum nitride, tantalum copper, tantalum silicon nitride, tungsten, tungsten nitride, tungsten silicon nitride, titanium nitride, titanium/titanium nitride, and titanium silicon nitride.

17. The method of claim 10, wherein the insulating material is silicon dioxide.

18. The method of claim 17, wherein the first conductive material and the second conductive material are copper.

* * * * *